United States Patent [19]

Haller et al.

[11] Patent Number: 5,077,639

[45] Date of Patent: Dec. 31, 1991

[54] CIRCUIT PLATE FOR THE OPTIMAL DECOUPLING OF CIRCUITS WITH DIGITAL IC'S

[75] Inventors: Manfred Haller, Gaggenau; Wolfgang Hagen, Baden-Baden; Christian Dirks, Donaueschingen, all of Fed. Rep. of Germany

[73] Assignees: Manfred Haller, Gaggenau; Wolfgang Hagen, Baden-Baden, both of Fed. Rep. of Germany; a part interest

[21] Appl. No.: 500,775

[22] Filed: Mar. 27, 1990

[30] Foreign Application Priority Data

Apr. 1, 1989 [DE] Fed. Rep. of Germany ....... 3910518
Feb. 1, 1990 [DE] Fed. Rep. of Germany ....... 4002901

[51] Int. Cl.⁵ .......................... H05K 7/06; H01P 3/08; H01G 1/035
[52] U.S. Cl. .................................... 361/400; 333/238; 361/392; 361/393; 361/396
[58] Field of Search ............... 361/306, 393, 396, 400, 361/401, 402, 405, 406, 392; 338/333, 334

[56] References Cited

U.S. PATENT DOCUMENTS 4,540,226 9/1985 Thompson et al. ................. 361/401
4,645,943 2/1987 Smith, Jr. et al. .................. 361/405
4,882,656 11/1989 Menzies, Jr. et al. ............. 361/393

Primary Examiner—Leo P. Picard
Assistant Examiner—Michael W. Phillips
Attorney, Agent, or Firm—Collard, Roe & Galgano

[57] ABSTRACT

The invention relates to a circuit plate for the optimal decoupling of circuits with digital integrated circuits. The plate is connected to an SMD capacitor and two conductor tracks connected to the capacitor and leading to the points to be decoupled. The plate is fittable with all precision contact connections present. Furthermore, the plate is adapted to the shape of the IC's or the IC base and, in each case, has a number of bores conforming to the number of contact pins of the IC's or to the number of contact connections of the IC base, whereby the conductor tracks leading to the SMD capacitor are relatively wide and lead to the connections of the points to be decoupled.

13 Claims, 4 Drawing Sheets

CIRCUIT PLATE FOR THE OPTIMAL DECOUPLING OF CIRCUITS WITH DIGITAL IC'S

BACKGROUND OF THE INVENTION

1. Field of the Invention

The invention relates to a circuit plate for the decoupling of circuits with digital IC's.

2. The Prior Art

In the decoupling circuits with digital IC's, so-called "decoupling or blocking capacitors" have to be arranged ahead of each IC-component, whereby a low inductivity and decoupling are required in order to prevent voltage drops from occurring during the switching integrated circuits (IC's).

The increasing speed of IC's has raised the requirements that have to be met with respect to efficient filtering and decoupling. The higher starting currents and faster rising times of integrated circuits generate higher voltage peaks. The high voltage peaks may substantially influence the proper function of the systems and, for that reason, have to be suppressed in a reliable way. Efficient decoupling primarily at higher frequencies can be produced only through reduced inductivity feed. With conventional decoupling or blocking capacitors, the inductivity can be reduced only slightly by a careful layout of the printed circuits. The intereference level of the decoupling capacitors conventionally used on conductor boards comes to about 310 mVss.

SUMMARY OF THE INVENTION

It is an object of the present invention to create an additional circuit plate for the optimal decoupling of circuits with digital IC's, which plate will prevent voltage drops and thus assure optimal decoupling, thereby providing for an extremely low inductivity and adaptation to all precision contact connections present.

The above object is accomplished in accordance with the present invention to providing a circuit plate of the type specified above, with the plate provided with an SMD-capacitor and two conductor tracks connected to the capacitor and leading to the contacts to be decoupled, the plate being fittable with all precision contact connections present.

According to a first embodiment, the circuit plate according to the invention is adapted to the shape of the IC's or of the IC-base and has a number of holes conforming to the number of contact pins of the IC's or of the base, whereby the conductor tracks leading to the SMD-capacitor are designed relatively wide and are leading to the connections of the points to be decoupled.

According to another embodiment, contact connections are inserted in the plate, and these connections extend across the plate and are adapted to the corresponding integrated circuit as the IC socket, whereby the contact connections to be decoupled are connected to the conductor tracks for the SMD-capacitor.

According to a further embodiment, the relatively wide conductor tracks for the SMD-capacitor may be connected to the diagonally disposed connection pins of the voltage supply and to the ground of the IC.

Several benefits are obtained with the circuit plate according to the invention; for example, the circuit plate may serve as a carrier for IC-components. Also, it may be used as an additional component for the simple later additional equipping of IC-sockets or IC-components, for the later additional fitting of IC-components, IC-sockets or wrap-contact connections previously mounted on or plugged into the conductor board.

In addition, the circuit plate may be marked with a so-called "wrap-ID" pin marking (address label) and at the same time used as a practical and time-saving auxiliary means in the wire-wrap wiring.

Finally, using the capacitor IC socket permits direct plugging in the same holes of the memory IC's, which significantly simplifies the layout in the manufacture of plates and permits reducing the costs of conductor board production.

As the capacitor plate or capacitor IC socket is inserted in the same holes as the IC, placement need not be taken into account in the conductor board layout. This means that the circuit plate according to the invention can be inserted in any existing conductor board without changing the layout, which means that the packing density can be increased up to 30% without requiring any additional conductor board surface area.

According to yet another embodiment, the circuit plate can be significantly enhanced further in that a particularly wide-banded decoupling up to a frequency of 300 MHz and more can be carried out. For said purpose, a circuit plate is provided and has the plate coated on both sides with metal, in particular copper. The conductor track is connected to the connection for the supply voltage and extends across the free width of the plate adjacent to the holes. It is divided by means of a recess within the material into two conductor tracks connected to each other, with the ends of said conductor tracks being separated by a recess within the material by a conductor track extending across the width of the plate and connected to the ground connection. Each end of the two divided conductor tracks is connected to the grounded conductor track via at least one decoupling capacitor, and in that the capacitors are connected to each other by at least one resistor.

According to yet another embodiment of the circuit plate, the conductor track is on the reverse side, with the track extending across the width of the plate adjacent to the holes, and is connected to ground as well.

The significant advantage obtained with the plate according to the invention is that a particularly wide-banded decoupling of the IC in the circuit is achieved up to a frequency of 300 MHz and higher.

According to another feature of the circuit plate, the ratio of the widths of the two divided conductor tracks connected to the supply voltage amounts to about 1:1 to 1:3.

The width of the conductor track connected to ground and having the capacitors connected to it approximately corresponds with the spacing between two holes in the conductor track. Of course, this spacing may be selected larger or smaller if this contributes to an even better decoupling.

According to a further embodiment of the plate, the capacity of the capacitor leading to the wider conductor track amounts to about 1 nF and the capacity of the capacitor leading to the more narrow conductor track comes to 0.1 uF, with the resistor connecting the two capacitors having a resistance of approximately 2.2 ohms. All components are preferably engineered using the so-called known "SMD-technology".

According to yet another embodiment, the thickness of the plate comes to about 0.5 mm.

As the plate is generally joined with the IC-socket, it may be combined with the latter by pressing it into the socket.

BRIEF DESCRIPTION OF THE DRAWINGS

Other objects and features of the present invention will become apparent from the following detailed description considered in connection with the accompanying drawing which discloses several embodiments of the present invention. It should be understood, however, that the drawing is designed for the purpose of illustration only and not as a definition of the limits of the invention.

In the drawing wherein similar reference characters denote similar elements throughout the several views.

DETAILED DESCRIPTION OF PREFERRED EMBODIMENTS

Figure 1:
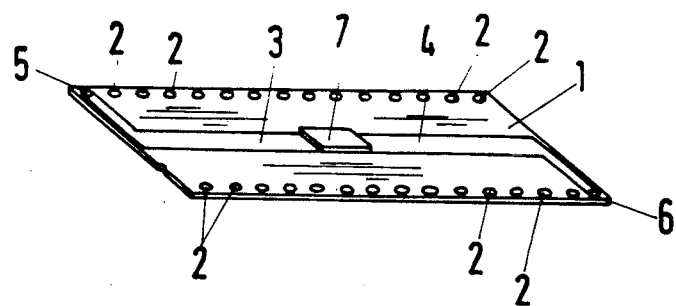
FIG. 1 shows a perspective view of an embodiment of the circuit plate according to the invention.

Turning now in detail to the drawings, FIG. 1 shows that the circuit plate of the invention includes a rectangularly shaped body 1 made of, for example, epoxide resin or some other suitable material. The rectangularly shaped plate body has a plurality of holes 2 conforming to the spacing and the arrangement of the pin contacts of an IC. The plate is fitted with two relatively wide conductor tracks 3, 4 with the usual arrangement on the plate. The tracks lead to the diagonally disposed bores 5, 6, where they are later connected to the connections of the IC. The two relatively wide conductor tracks 3, 4 lead to an SMD-decoupling capacitor 7. The conductor tracks 3 and 4 may have any desired shape and geometric layout and arrangement.

Figure 2:
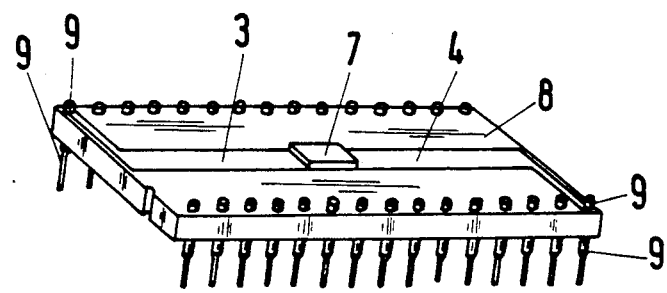
FIG. 2 shows another embodiment of the circuit plate of the invention, namely the IC-socket or frame.

FIG. 2 shows another embodiment of the circuit plate of the invention. Here the contact connections 9 extending across the plate are inserted in a slightly thicker plate 8 in correspondence with the contact pins of the IC to be inserted. The contact connections are the IC socket or frame, whereby the two conductor tracks 3 and 4, which are connected to the SMD-capacitor 7, lead to the two outer, diametrically opposed contact connections.

Figure 3:
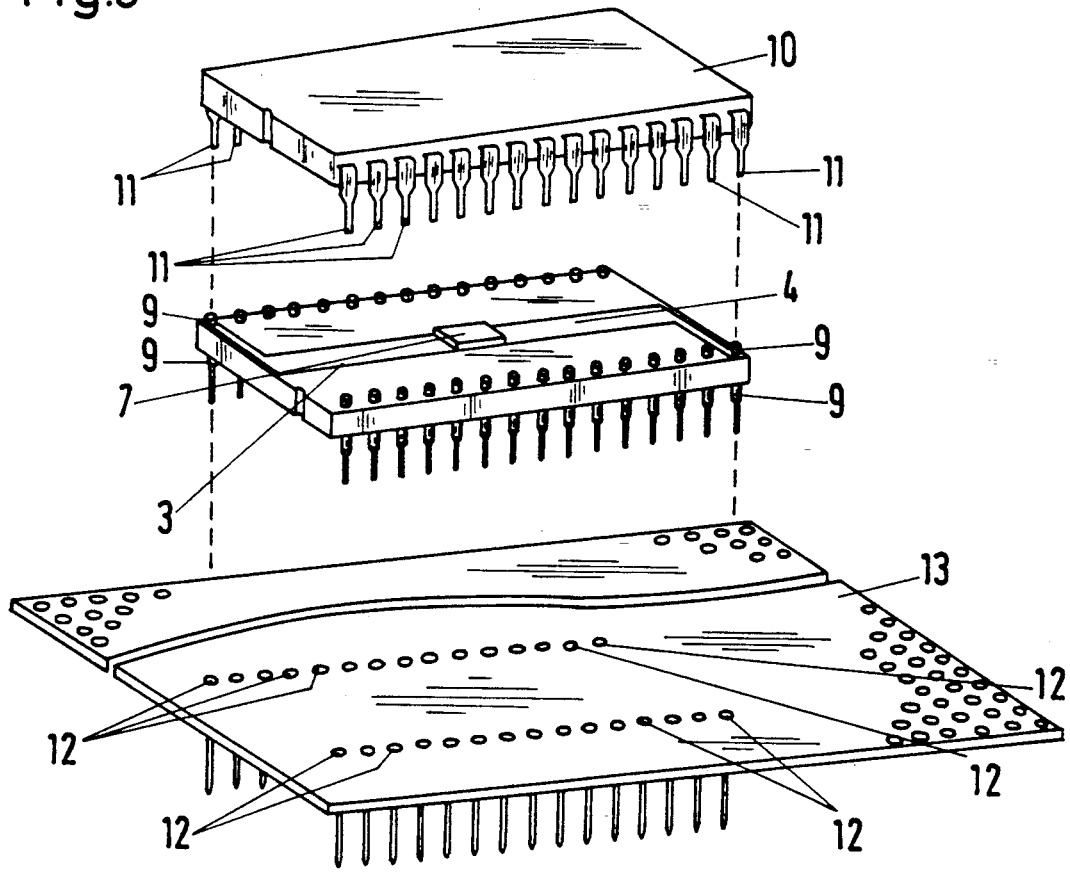
FIG. 3 shows an exploded perspective view of a first assembly for the circuit plate in connection with an IC and a conductor board.

FIG. 3 shows one assembly for using the circuit plate according to the invention as shown in FIG. 2. With its contact pins 11, the IC 10 is plugged into the contact connections 9 of the circuit plate of the slightly thicker plate 8 serving as the IC socket. The total assembly is then plugged into the through-contacted openings or holes 12 of the circuit conductor board 13 and connected to the latter in the usual and known way by soldering.

Figure 4:
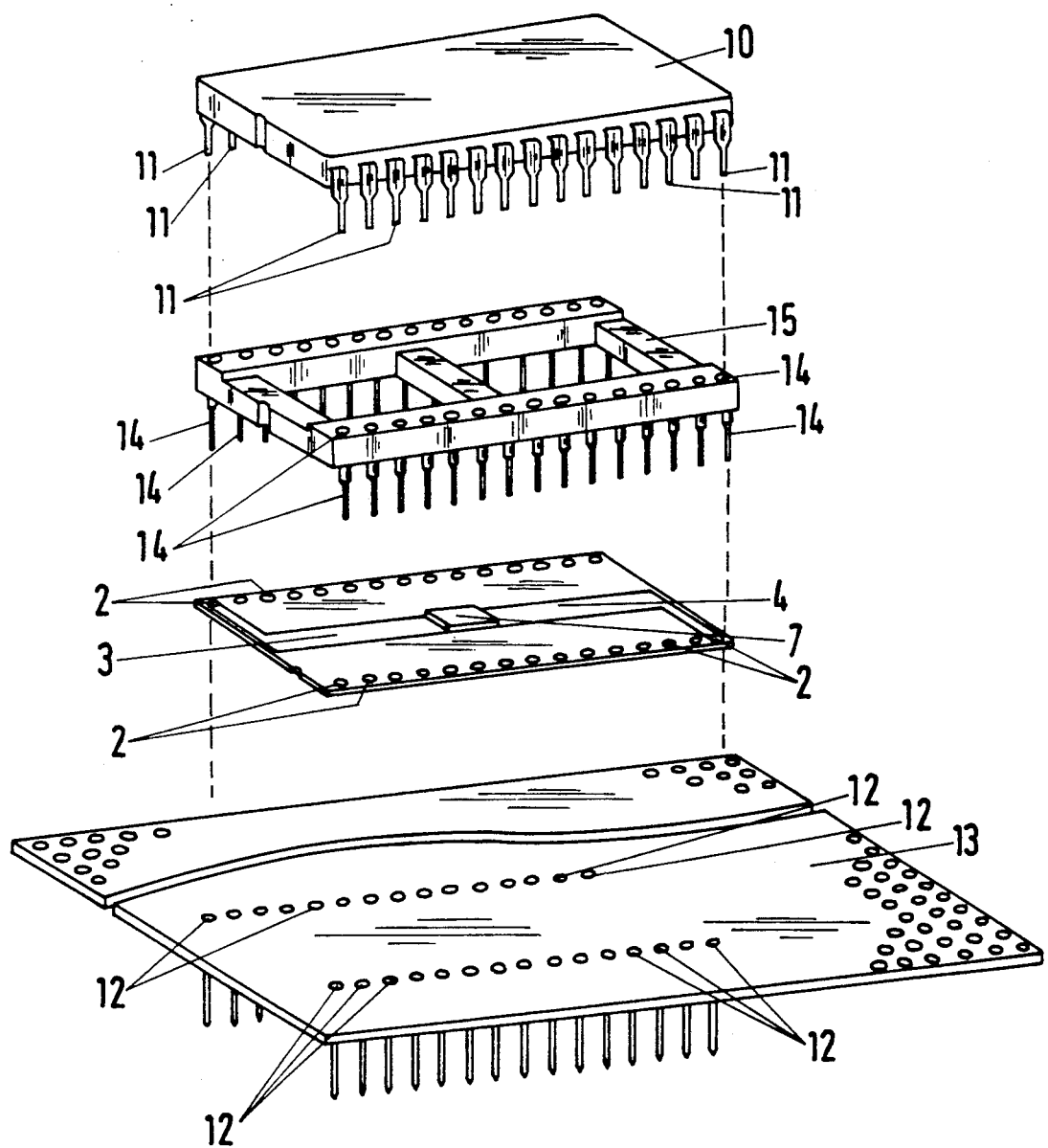
FIG. 4 is a view similar to FIG. 3, showing a circuit plate according to FIG. 1.

FIG. 4 shows another assembly for connecting the IC 10 to the contact pins 11, whereby the pins are plugged into the contact connections 14 of an IC socket 15. A circuit plate as shown in FIG. 1 is plugged onto the contact connections 14 of the IC socket 15 from the bottom in such a way that the contact connections 14 penetrate the holes 2 of the circuit plate 1 with their bottom pins. The connection of the two conductor tracks 3 and 4 is established by way of the diametrically opposed connections 14, to which the supply voltage and the ground are connected. The total arrangement or assembly is then plugged again into the bores 12 of the conductor circuit board 13 and connected to the latter in the known manner, for example by soldering.

Figure 5:
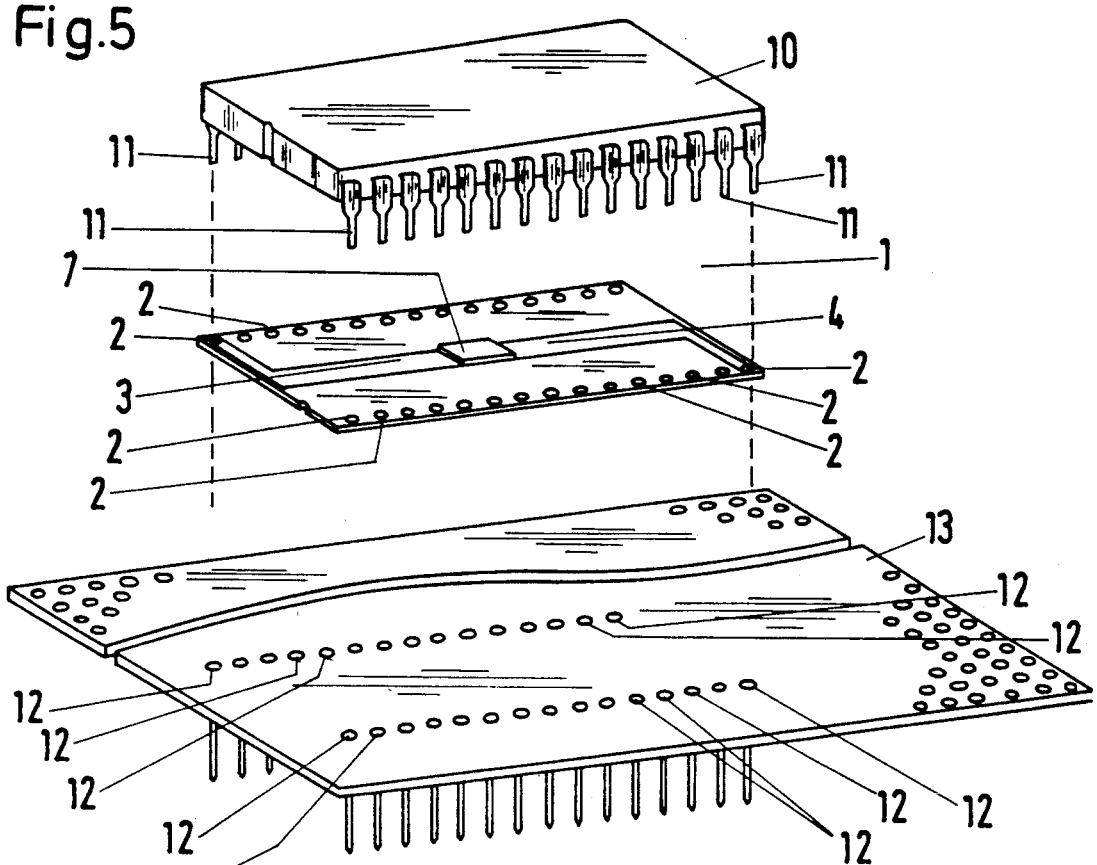
FIG. 5 is a view similar to FIG. 3, showing another embodiment of the circuit plate according to the invention.

FIG. 5 shows a further embodiment of the invention. In this embodiment, the IC 10 is directly plugged into the circuit plate 1 with its connection pins 11, whereby the latter extend through the openings or holes 2 of the plate and the diametrically extending pins 11 are connected via the conductor tracks 3, 4 by way of the decoupling capacitor 7. The IC is then directly plugged into the holes 12 of the conductor circuit board 13 and joined with the latter, for example by soldering.

Figure 6:
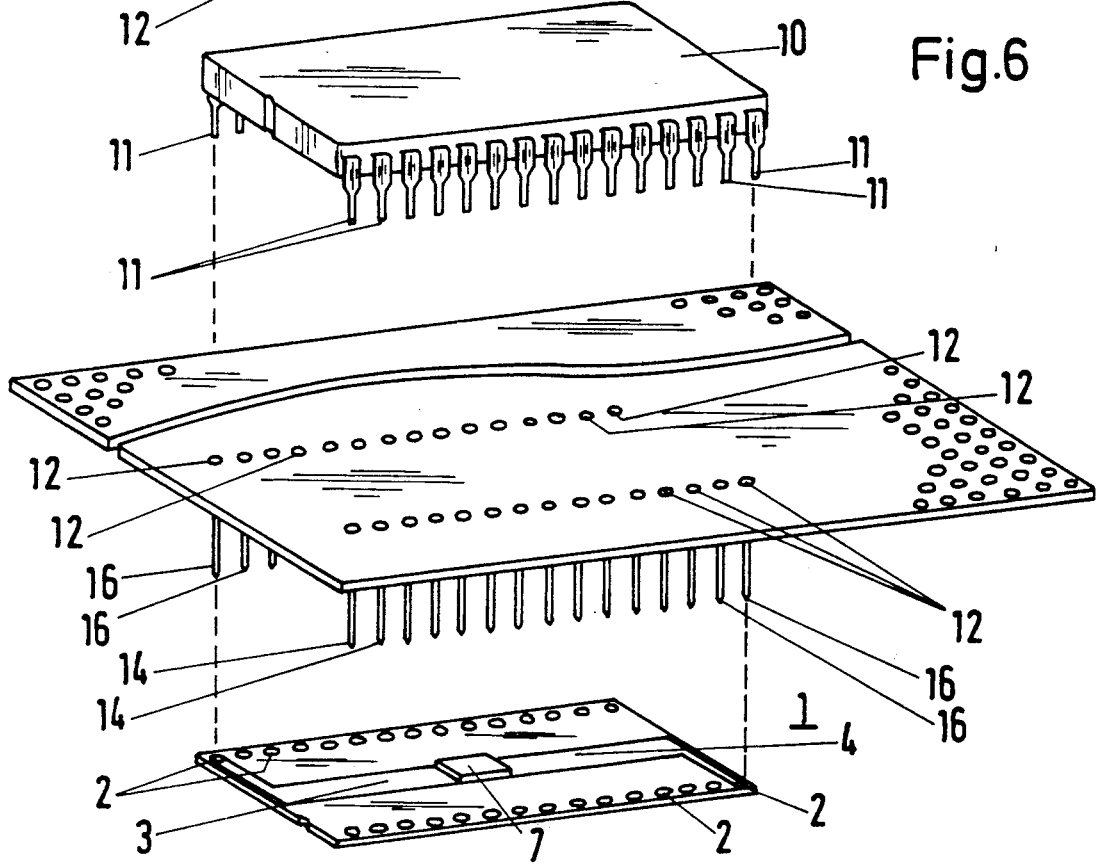
FIG. 6 shows an exploded perspective view of another assembly for the circuit plate according to the invention.

A reverse arrangement for the assembly is shown in FIG. 6, where the IC 10, with its connections 11, is directly plugged into the holes 12 of the conductor circuit board 13 and joined with the latter by soldering. The circuit plate 1 with its openings 2 is mounted on the through-extending pins from the bottom and joined with the diametrically opposed connection pins 14 by soldering.

The circuit plate according to the invention can be used with 14, 16, 18, 20, 22, 24, 28, 30, 32, 36, 40, 42, 48 and 64-pole connections for standard DIP-IC's with diagonally arranged voltage supply and ground connections. Designs with other current supply and ground connections are, of course, possible as well. The basic material used for the circuit plate of the invention may consist of epoxide resin with a thickness of 0.5 to 1.5 mm.

The plate according to the invention may be used also for other IC-components, pin-grid-array sockets, as well as for PLCC and LCC sockets.

Figure 7:
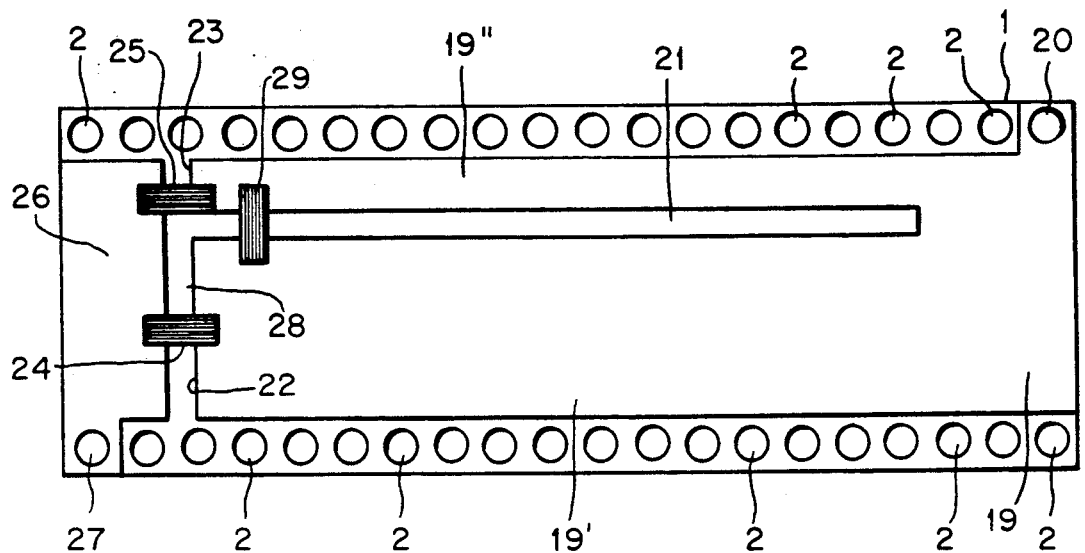
FIG. 7 shows a plan view of the plate of the invention, showing the side of the plate which is fitted.
Figure 8:
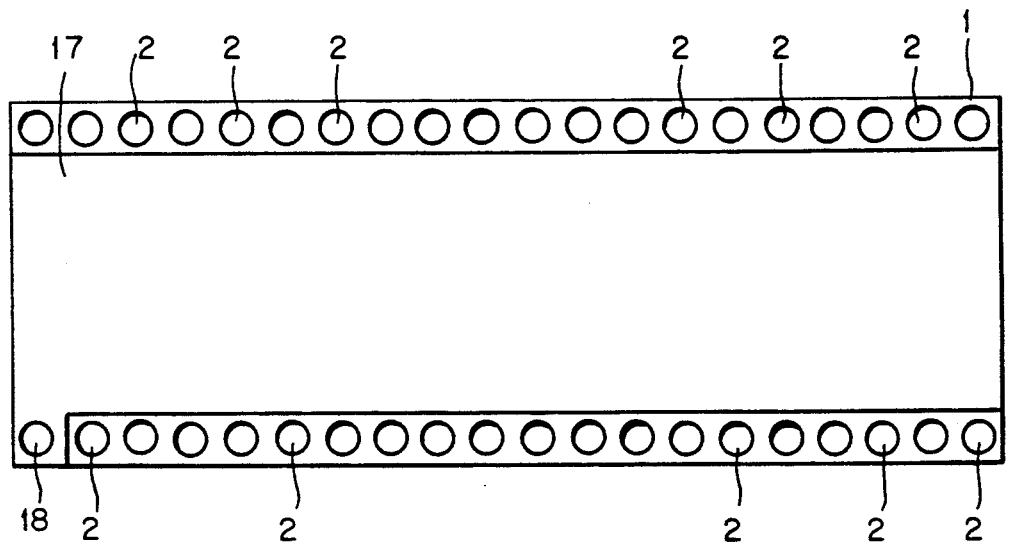
FIG. 8 is a plan view of the reverse side of the plate according to FIG. 7.

FIGS. 7 and 8 show that the circuit plate according to the invention comprises a rectangularly shaped plate body 1, for example made of epoxide resin or some other suitable material, which is coated on both sides. The plate body 1 is fitted with a plurality of holes 2 conforming to the spacing and arrangement of the pin contacts of the IC. On the back side, the conductor track 17 extending across the width of the plate adjacent to the holes 2 is applied by coating in the form of a metal layer or coating connected to the ground connection 18 (FIG. 8). The fitting side (FIG. 7) of the plate 1, too, has a conductor track 19 extending across the free width of the plate adjacent to the holes 2. The track 19 is connected to the supply voltage connection 20. The conductor track 19 is divided by a recess 21 within the material into two conductor tracks 19', 19'', which are connected to each other.

The ends 22, 23 of the two conductor tracks are each connected via a capacitor 24 of 1nF and a capacitor 25 of 0.1 uF to an additional conductor track 26, the latter being connected to the ground connection 27 and separated from the two conductor tracks 19', 19'' by another material recess 28.

Within the zone of the ends of the conductor tracks 19', 19", the two capacitors 24, 25 are connected to a resistor 29 of approximately 2.2 ohms. All components may be engineered using the SMD-technology.

The plate so structured in accordance with the invention may be joined with the IC socket by pressing it into the latter under pressure.

While several embodiments of the present invention have been shown and described, it is to be understood that many changes and modifications may be made thereunto without departing from the spirit and scope of the invention as defined in the appended claims.

What is claimed is:

1. A circuit plate for the optimal decoupling of points within circuits with digital integrated circuits (IC's) comprising:
   a plate;
   a recess within the material of the plate dividing said plate into two interconnected divided conductor tracks, said conductor tracks having ends being separated by a second recess within the material from a third conductor track extending across the width of the plate and being connected to a ground connection;
   two decoupling capacitors;
   each end of the two divided conductor tracks is connected to the third grounded conductor track by at least one of said decoupling capacitors;
   at least one resistor bridging the ends of the two interconnected divided conductor tracks, thereby electrically connecting the capacitors to each other;
   said two divided interconnected conductor tracks of said plate being connected to a power connection;
   wherein the plate geometry is adapted to mate with an IC, said plate being fitted with contact connections;
   said contact connections and said power and ground connections extending across the plate forming an IC socket, whereby the power connection which is to be decoupled are connected to the two divided interconnected conductor tracks and the ground connection which is to be decoupled is connected to said third conductor track;
   wherein said plate has a first side and a reverse side, said plate being coated on both sides with metal, said plate having holes extending from the first side to the reverse side; and
   said two divided interconnected conductor tracks are connected to the power connection for the supply voltage and extending across the free width of the plate adjacent to the holes.

2. A circuit plate as defined in claim 1, with an additional conductor track on the reverse side, and connected to ground.

3. A circuit plate as defined in claim 1, wherein the ratio of the widths of the divided interconnected conductor tracks ranges between about 1:1 to 1:3.

4. A circuit plate as defined in claim 1, wherein the width of the recess between the third grounded conductor track and the two interconnected conductor tracks approximately conforms to the spacing between two holes.

5. A circuit plate as defined in claim 1,
   wherein one of said two interconnected divided conductor tracks is the wider conductor track, and the other of said two interconnected divided conductor tracks is the more narrow conductor track;
   wherein the capacitor leading to the wider conductor track amounts to about 1 nF;
   wherein the capacitor leading to the more narrow conductor track amounts to about 0.1 uF;
   wherein the resistor connecting the capacitors amounts to about 2.2 ohms; and
   wherein said components are constructed in SMD-technology.

6. A circuit plate as defined in claim 1, wherein the circuit plate has a thickness of approximately 0.5 mm.

7. A circuit plate mounted to an IC base for the optimal decoupling of points within circuits with a digital integrated circuit (IC) base comprising:
   a plate;
   a recess within the material of the plate dividing said plate into two interconnected divided conductor tracks; said conductor tracks having ends being separated by a second recess within the material from a third conductor track extending across the width of the plate and being connected to a ground connection;
   two decoupling capacitors;
   each end of the two divided conductor tracks is connected to the third grounded conductor track by at least one of said decoupling capacitors;
   at least one resistor bridging the ends of the two interconnected divided conductor tracks, thereby electrically connecting the capacitors to each other;
   said two divided interconnected conductor tracks of said plate being connected to a power connection;
   wherein the plate is mounted to the IC base, said plate being fitted with contact connections;
   said contact connections and said power ground connections extending across the plate forming an IC base socket, whereby the power connection which is to be decoupled is connected to the two divided interconnected conductor tracks and the ground connection which is to be decoupled is connected to said third conductor track;
   wherein said plate has a first side and a reverse side; said plate being coated on both sides with metal; said plate having holes extending from the first side to the reverse side; and
   said two divided interconnected conductor tracks are connected to the power connection for the supply voltage and extending across the free width of the plate adjacent to the holes.

8. A circuit plate as defined in claim 7,
   further comprising means for press fitting the plate into the IC-base, so that the plate is joined with the IC-base.

9. A circuit plate as defined in claim 7, with an additional conductor track on the reverse side, and connected to ground.

10. A circuit plate as defined in claim 7, wherein the ratio of the widths of the divided interconnected conductor tracks ranges between about 1:1 to 1:3.

11. A circuit plate as defined in claim 7, wherein the width of the recess between the third grounded conductor track and the two interconnected conductor tracks approximately conforms to the spacing between two holes.

12. A circuit plate as defined in claim 7,
    wherein one of said two interconnected divided conductor tracks is the wider conductor track, and the other of said two interconnected divided conductor tracks is the more narrow conductor track;

wherein the capacitor leading to the wider conductor track amounts to about 1 nF;

wherein the capacitor leading to the more narrow conductor track amounts to about 0.1 uF;

wherein the resistor connecting the capacitors amounts to about 2.2 ohms; and wherein said components are constructed in SMD-technology.

13. A circuit plate as defined in claim 7, wherein the plate has a thickness of approximately 0.5 mm.

* * * * *